United States Patent
Moore et al.

(10) Patent No.: US 10,361,708 B1
(45) Date of Patent: Jul. 23, 2019

(54) SYSTEMS AND METHODS FOR SHARING MULTIPLE LOCK-DETECT CIRCUITRIES OR MULTIPLE PHASE LOCKED LOOP BLOCKS

(71) Applicant: Altera Corporation, San Jose, CA (US)

(72) Inventors: Christopher Thomas Moore, Saratoga, CA (US); Bo Zhou, Milpitas, CA (US); Rajiv Kane, Fremont, CA (US)

(73) Assignee: ALTERA CORPORATION, San Jose, CA (US)

( * ) Notice: Subject to any disclaimer, the term of this patent is extended or adjusted under 35 U.S.C. 154(b) by 276 days.

(21) Appl. No.: 15/277,783

(22) Filed: Sep. 27, 2016

(51) Int. Cl.
| H03L 7/095 | (2006.01) |
| H03L 7/08 | (2006.01) |
| H03L 7/099 | (2006.01) |
| H03L 7/23 | (2006.01) |
| H04L 7/033 | (2006.01) |

(52) U.S. Cl.
CPC ............ *H03L 7/095* (2013.01); *H03L 7/0807* (2013.01); *H03L 7/099* (2013.01); *H03L 7/23* (2013.01); *H04L 7/0331* (2013.01)

(58) Field of Classification Search
CPC ....... H03L 7/095; H03L 7/0807; H03L 7/099; H03L 7/23; H04L 7/0331
USPC .......... 327/147–163; 375/373–376; 331/1 R, 331/1 A
See application file for complete search history.

(56) References Cited

U.S. PATENT DOCUMENTS

2003/0112913 A1* 6/2003 Balasubramanian ........................
H03D 13/004
375/373

* cited by examiner

*Primary Examiner* — Tomi Skibinski
(74) *Attorney, Agent, or Firm* — Fletcher Yoder, P.C.

(57) ABSTRACT

Systems and methods related to phase-locked loops circuitry and lock-detect circuitry are provided. Some of the systems and methods allow sharing of lock-detect circuitries between multiple phase-locked loops or other suitable circuitry. Others allow multiple circuitries to select from multiple lock-detect circuitries that may use different lock-detect techniques.

13 Claims, 5 Drawing Sheets

SYSTEMS AND METHODS FOR SHARING MULTIPLE LOCK-DETECT CIRCUITRIES OR MULTIPLE PHASE LOCKED LOOP BLOCKS

BACKGROUND

This disclosure relates to using multiple lock-detect circuitries with one or more phase locked loop (PLL) circuitries.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Many electrical devices, such as mobile phones, computers, automotive electronic, communication systems, and industrial machinery among others, employ digital data processing circuitry that may operate according to clock signals. In many cases, the clock signals are provided to the digital data processing circuitry by phase-locked loop (PLL) modules. PLL modules are circuitry that provide stable and accurate clock signals by receiving an input clock signal from some clock source (e.g., a serial data signal) and outputting a stabilized clock signal that may be used for synchronization of the digital data processing circuitry. In basic terms, a PLL module may detect and synchronize the phases of an input clock signal and the phases of the output clock signal, resulting in a stable output clock signal. If the output clock signal reaches an acceptable level of stability, it may be considered locked.

Parts of an electrical device that receive clock signals from a PLL may benefit from receiving information related to whether the clock signal from the PLL is locked. In some systems, specialized lock-detect circuitry may be responsible for identifying whether the clock signal from the PLL is locked. The specialized lock-detect circuitry may occupy a region of the circuit which may be a constrained resource in some systems.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments of the disclosure relate to methods and systems that may allow flexible usage of lock-detect circuitry by phase-locked loop circuitry in electrical systems and devices. In one example, an electrical system includes a phase-locked loop circuitry with an internal lock-detect circuitry. The electrical system may also include an external lock-detect circuitry that is coupled to the phase-locked loop circuitry and a selector module that may receive lock-detect signals from the internal and the external lock-detect circuitries. The selector may output a lock-detect signal that may indicate a quality of the output clock signal.

In another example, an electrical system includes a first phase-locked loop that produces an output clock signal. The electrical system may also include a first lock-detect circuitry and a second lock-detect circuitry, both of which receive at least a clock signal from the phase-locked loop circuitry, and produce a lock-detect signal. The electrical system may also include a selector module that receives the two lock-detect signals from the two lock-detect circuitries and produces a third lock-detect signal. The first and the second lock-detect signals may be based on a quality of the output clock signal.

In another example, a lock-detect bank is disclosed. The lock-detect bank may have multiple lock-detect modules, wherein each lock-detect module is capable of producing a lock-detect signal using a quality of a received periodic signal. The lock-detect bank may also include an input switchbox that routes received clock signals from a set of inputs and routes it to the appropriate lock-detect module. The lock-detect bank may also include an output switchbox that routes lock-detect signals produced by the lock-detect modules to the appropriate output from the set of outputs of the lock-detect bank. Routing provided by both input and output switchboxes may be performed employing a mapping that associates each lock-detect module with an input of the input switchbox and an output of the output switchbox.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present invention alone or in any combination. Again, the brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
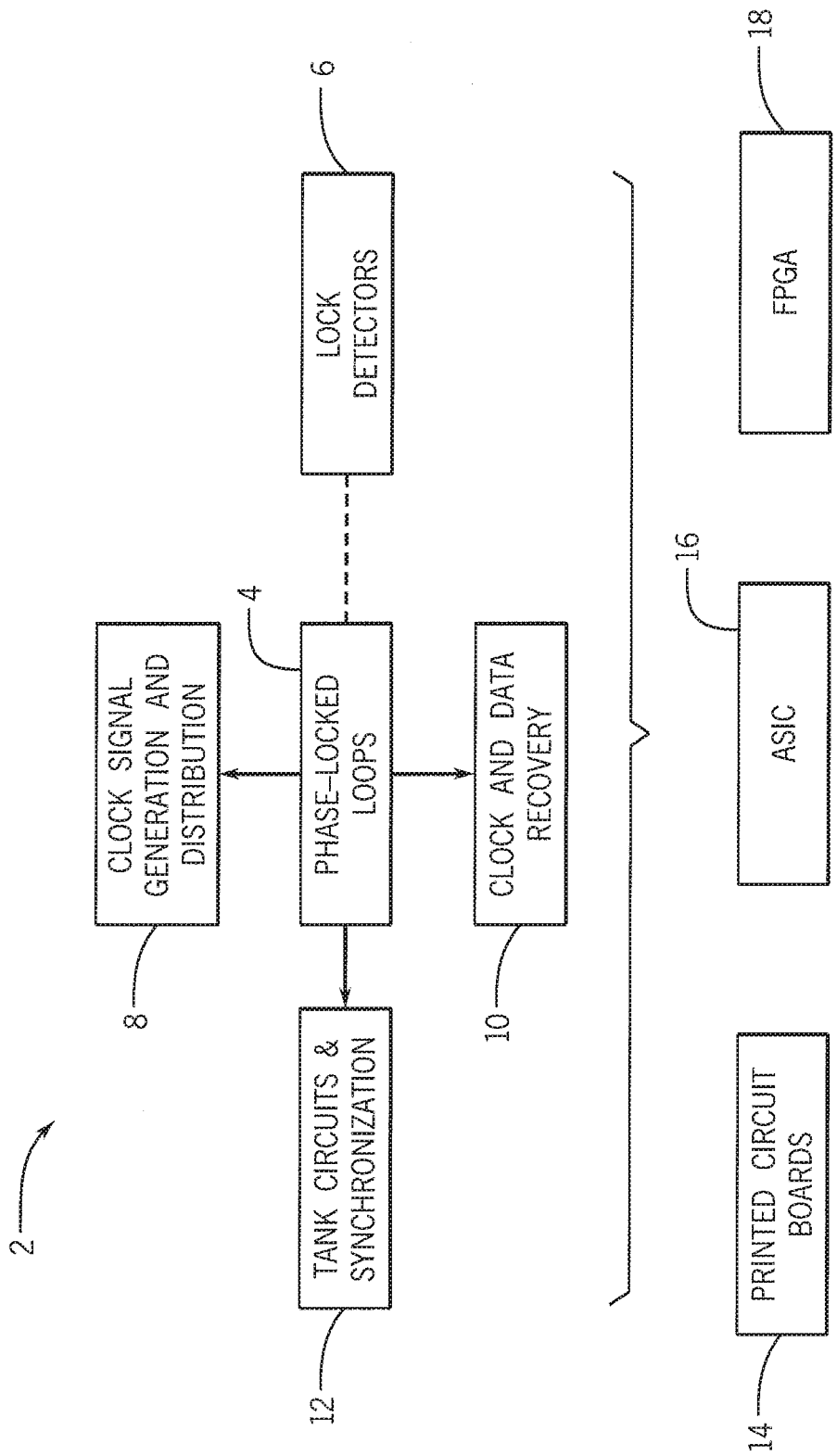
FIG. 1 is a block diagram that illustrate systems, modules and circuits that may employ phase-locked loop (PLL) modules and lock-detect circuitry, in accordance with an embodiment.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

Several electrical and electronic systems may employ phase-locked loop (PLL) modules to provide stable clock signals to the system. A phase-locked loop module is circuitry that may receive an input clock signal and compare it to an output clock signal. The comparison may be between the phases, or between the frequencies of the input clock signal and the output signal. The comparison may be used as a feedback signal to synchronize the output clock signal with the input clock signal. As a result, the output clock signal provided by a PLL may be a highly stable signal with respect to both phase and frequency.

The quality of the output signal from a PLL module may be quantified through lock-detect circuitry, which may be external to the PLL module. Usually, the quality may be evaluated as the difference between phase and frequency of the reference clock and the return clock signal. In some use cases, the quality is difference between the phases of the reference clock and the return clock signal, such as the case when the PLL produces an output clock signal that is a multiple of the input clock signal. Note that the return clock signal may be the output clock signal, a pre-processed version of the output clock signal or even a return signal from the electrical device. For example, if a desired output clock signal has a frequency that is a multiple of the frequency of the input the reference clock may be an output clock signal processed by an appropriate frequency divider. If the output PLL signal from a PLL module reaches a satisfactory level of stability, the output clock signal may be deemed locked. Usually, once an output clock signal is locked, it stays locked for several clock cycles. Therefore, if a lock-detect circuitry is coupled to a single PLL module, the lock-detect circuitry may be idle for long periods, which may result in reduced efficiency in the utilization of resources such as power consumed and physical space in the circuit layout. Embodiments illustrate methods and systems that allow sharing a lock-detect circuitry between multiple PLL modules, leading to an increased efficiency in the utilization of resources.

Moreover, in some use cases, a PLL module may have multiple configurations that may change characteristics of the output frequency that may affect the functionality of a lock-detect circuitry. For example, PLL modules may include integer and/or fractional frequency dividers to alter the frequency of the clock, as described below. Some types of lock-detect circuitries, such as digital lock-detects, may be more appropriate for PLL modules employing fractional divider, and may be less effective than other types of lock-detect circuitries, such as analog lock-detects, to evaluate clock signal from a PLL module using a non-fractional divider. Systems in which a PLL module has multiple configurations may benefit from being able to select a lock-detect circuitry that is more appropriate, as detailed in embodiments described below.

With the foregoing in mind, the block diagram 2 of FIG. 1 provides examples of some types of circuits that may employ a stable clock signal provided by a PLL module 4 that is associated to lock-detect circuitry 6. For example, a synchronous digital circuit may employ PLL modules 4 for clock generation and distribution (block 8). Delays from variations in the path lengths in the clock distribution network of a synchronous digital circuit may lead to unstable clock signal and resulting undesired effects. By using a PLL module 4, a clock signal from the clock distribution network may be used as a feedback input of a PLL module 4, to improve synchronization of the clock signal across the circuit. Moreover, a signal from lock-detect circuitry 6 associated to the PLL module 4 may be used to detect when operation is "safe" (i.e., the components of the circuit are receiving stable and synchronous clock signals and are less likely to malfunction due to erroneous or non-synchronized clock signals).

PLL modules 4 may also be found in clock and data recovery modules 10. In reception circuitry of high-speed serial data channels, the input signal received may be a binary digital signal with no accompanying clock signal. In order to obtain a clock signal that may be used to facilitate decoding, a clock with an estimated frequency may be provided to a PLL module 4, and the incoming serial data may be used to refine the clock frequency and/or to align the phase between the data stream and the internal reference clock. A lock-detect circuitry 6 may be used to identify when the incoming serial data in the clock and data recovery module 10 is being correctly decoded based on a stabilization of the clock signal in the PLL module 4. In other implementations using high-speed serial duplex channels, the phase of an input signal and the phase of an output signal may be synchronized within the system using a PLL module 4. In such use cases, lock-detect circuitry 6 may be used to inform whether this synchronization has been achieved.

Another example of electrical systems that may employ PLL modules 4 are radio frequency (RF) equipment. Modulation and demodulation circuitry 12 usually found in radio transmitters and radio receivers, respectfully, may employ PLL modules 4 to obtain stable frequency values to be used as reference clock signals. Note that radio transmitters and radio receivers that have adjustable frequencies may employ a reconfigurable PLL module 4 equipped with frequency multipliers to change the value of the reference frequency used by the modulation and demodulation circuitry 12. Frequency multipliers in reconfigurable PLL module 4 may be integer multipliers, fractional multipliers or non-fractional multipliers. In modulation and demodulation circuitry 12, a lock-detect circuitry 6 associated to a phase-locked loop may be used to provide information on the quality of the reference signal and, thus, the quality of the modulation and/or demodulation.

Note that block diagram 2 does not provide an exhaustive list of use cases for phase-locked loop modules 4 associated to lock-detect circuitries 6. Note also that phase-locked loop modules 4 may be implemented in different types of circuitry such as in printed circuit boards 14 using discrete components, or in integrated circuits in the format of application-specific integrated circuits 16 or field-programmable gate arrays 18. Moreover, embodiments described above and detailed below may use any other method to implement circuits.

Figure 2:
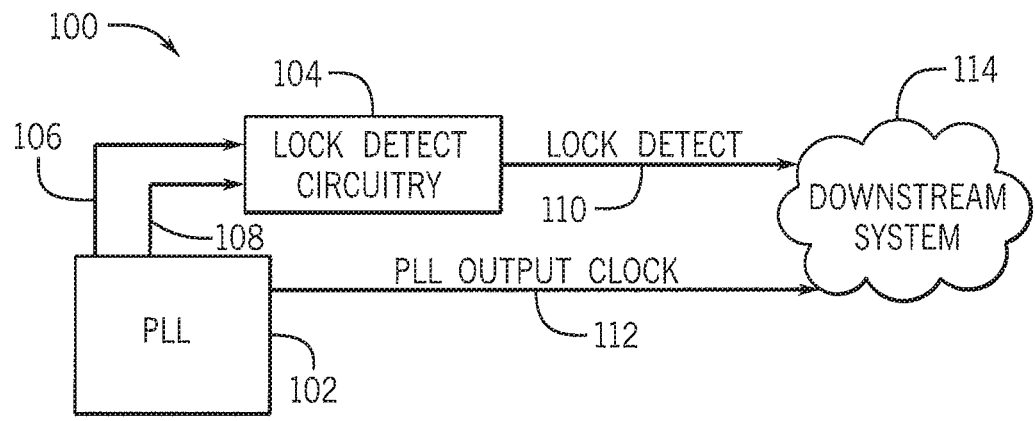
FIG. 2 is a block diagram illustrating a system with PLL module that connects to lock-detect circuitry and that provides a clock signal to a downstream system, in accordance with an embodiment.

A block diagram 100 in FIG. 2 illustrates an embodiment in which a PLL 102 is used along with a lock-detect circuitry 104. The PLL 102 provides to the lock-detect circuitry 104 a reference clock signal 106 and a return clock signal 108.

The reference clock signal 106 may be an input clock signal received by the PLL. In some systems, the reference clock signal 106 may be serial data signal. The return clock signal 108 may be the PLL output clock 112, a modified version of the PLL output clock 112 (e.g., processed by a frequency divider), or a reference signal obtained from the downstream system 114 for feedback. The reference clock signal 106 may be compared to the return clock signal 108 to provide a lock-detect signal 110. To that end, the difference in frequency and/or phase between reference clock signal 106 and return clock signal 108 is quantified and compared to a quality threshold. If the lock-detect circuitry determines that quality of the PLL output clock 112 from PLL 102 is above the quality threshold, the lock-detect circuitry 104 may provide a lock-detect signal 110 to a downstream system 114 that is also receiving the PLL output clock 112. Through logical operations or through any other suitable processing, downstream system 114 may determine whether to use the PLL output clock 112 or not based on the lock-detect signal 110.

Figure 3:
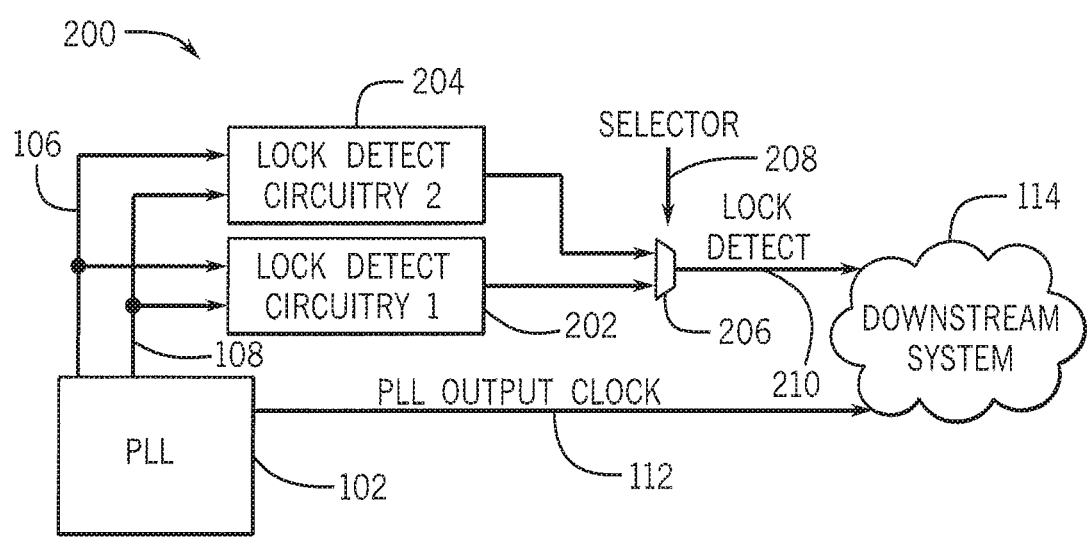
FIG. 3 is a block diagram illustrating a system in which a PLL module may be connected to two different lock-detect circuitries, and that may be providing a clock signal to a downstream system, in accordance with an embodiment.

Block diagram 200 in FIG. 3 illustrates another embodiment in which a PLL 102 may choose between multiple lock-detect circuitries to obtain a lock-detect signal. In this system, two different lock-detect circuitries 202 and 204 may receive the reference clock signal 106 and the return clock signal 108 from PLL 102. Lock-detect circuitries 202 and 204 may be of different types. For example, lock-detect circuitry 202 may be an analog lock-detect circuitry and lock-detect circuitry 204 may be a digital lock-detect circuitry. Each of the lock-detect circuitry may generate its own lock-detect signal that may be received by a multiplexor 206 or any other switching system. A selection signal 208 that controls the multiplexor 206 may be used to determine whether the lock-detect signal 210 provided to downstream system 114 is from lock-detect circuitry 202 or lock-detect circuitry 204. In some systems, the selection signal 208 may be sent by the PLL 102 and may be determined by the specific operating configuration of the PLL. Note that in some systems, a logic gate may be used instead of a multiplexor 206. For example, an "and" gate may be used to indicate that both lock-detect circuitries 202 and 204 detected a locked PLL 102.

As mentioned above, some lock-detect circuitries may not properly operate in all operating conditions of a PLL. For example, a PLL 102 may employ an integer frequency divider or a fractional frequency divider to obtain an output frequency that is a multiple of the reference frequency. In some systems, the integer frequency divider (e.g., non-fractional divider) may employ analog lock-detect circuitry 202, whereas a fractional frequency divider may employ digital lock-detect circuitry 204. Therefore, based on the configuration of PLL 102, the selection signal 208 may be adjusted such that the multiplexor 206 provides the lock-detect signal 210 from the appropriate lock-detect circuitry 202 or 204.

Figure 4:
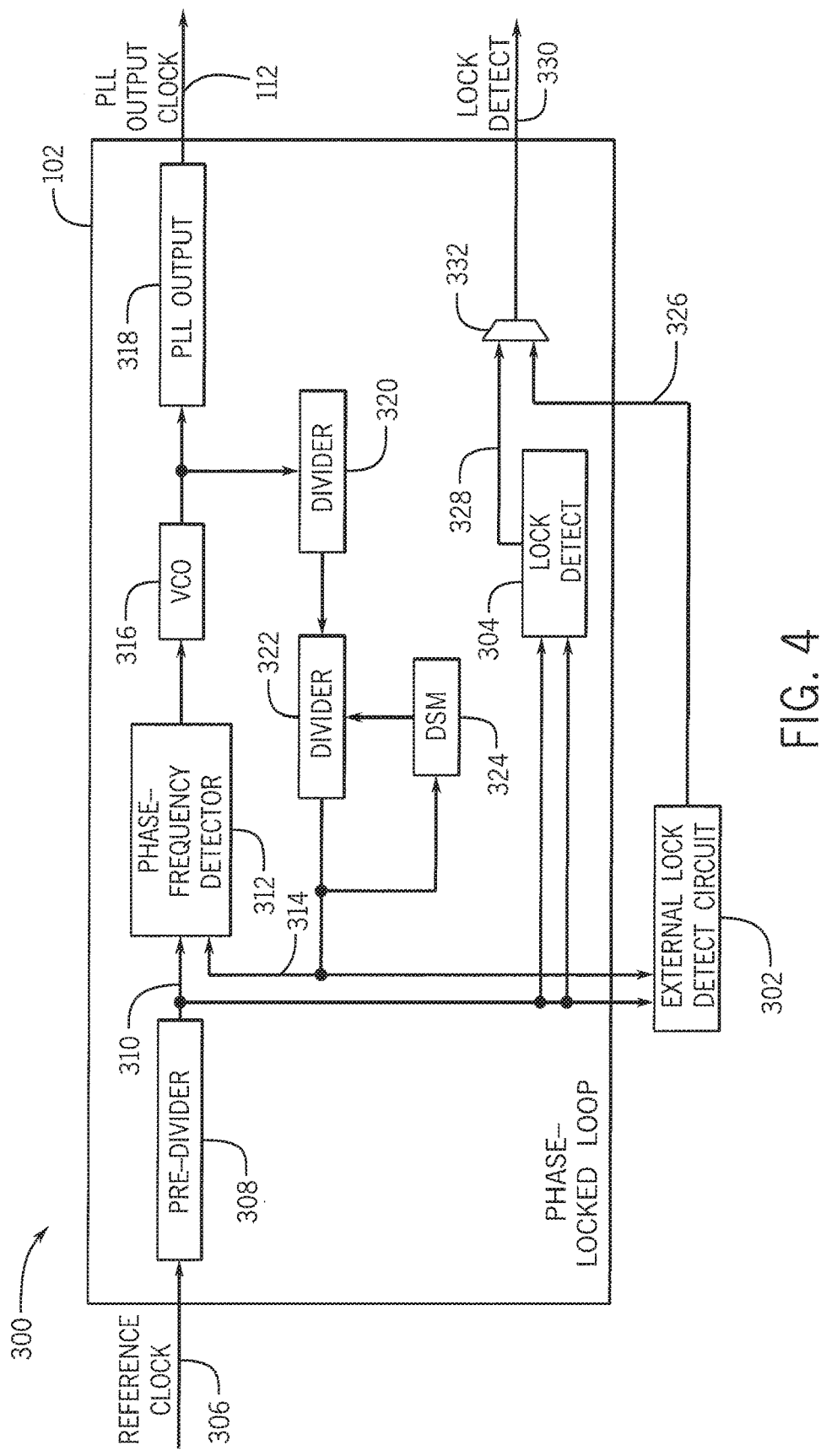
FIG. 4 is a block diagram illustrating connections between a PLL module and lock-detect circuitry, in accordance with an embodiment.

Diagram 300 in FIG. 4 provides an illustration of a PLL 102 that may choose between an external lock-detect circuitry 302 and internal lock-detect circuitry 304. The PLL 102 may have an external reference clock 306, which is fed to a pre-divider block 308. The resulting internal reference clock 310 may be provided to the phase-frequency detector 312, where it is compared with a return clock signal 314. An output of the phase-frequency detector 312 is provided to a voltage controlled-oscillator (VCO) 316. The VCO 316 may provide a periodic signal to a PLL output module 318, which may include a frequency divider, a filter, or some other electronic component that may be used to shape an oscillating signal and produce PLL output clock 112.

The periodic signal from the VCO 316 may also be provided to a first divider 320, which may be a frequency divider. The signal may be provided to a second divider 322, which operates in a feedback arrangement with a delta sigma modulator (DSM) 324. Dividers 320 and 322, and DSM 324 may operate together to provide a fractional frequency divider, an integer frequency divider or some other non-fractional frequency divider. The output of this divider path produces a return clock signal 314, which may be compared with the internal reference clock 310, as described above. The use of a frequency divider in the production of a return clock signal 314 may assist the PLL 102 in producing a PLL output clock 112 with a frequency that is higher than external reference clock 306.

In order to identify whether the PLL output clock 112 from PLL 102 is locked, internal reference clock 310 and return clock signal 314 may be provided to both an external lock-detect circuitry 302 and an internal lock-detect circuitry 304. The internal lock-detect circuitry 304 and external lock-detect circuitry 302 may employ different techniques to identify if the PLL 102 has reached stability. For example, internal lock-detect circuitry 304 may be a digital lock-detect and external lock-detect circuitry 302 may be an analog lock-detect. In some implementations, the internal lock-detect circuitry 304 may be a lower-accuracy lock-detect and external lock-detect circuitry 302 may be a higher-accuracy lock-detect. For example, an external lock-detect circuitry 302 may have an error range on the order of less than a part per million, while the internal lock-detect circuitry 304 may have an error range on the order of a part per thousand. External lock-detect circuitry 302 may produce a lock-detect signal 326 and internal lock-detect circuitry 304 may produce an internal lock-detect signal 328. A resulting lock-detect signal 330 may be chosen from lock-detect signals 326 and 238 by a multiplexor 332. Note that a logic gate may be placed in place of multiplexor 332 and perform logic operations with inputs as lock-detect signal 326 and internal lock-detect signal 328.

The external lock-detect circuitry 302 may be a system that consumes more power than internal lock-detect circuitry 304. In these situations, it may be useful for the system if the PLL employed the internal lock-detect circuitry 304 routinely and employed the external lock-detect circuitry 302 in special situations such as during start-up, configuration changes or other situations that may lead to changes in the phase or frequency of the external reference clock 306. Moreover, the external lock-detect circuitry 302 may be powered down while it is not being used.

Figure 5:
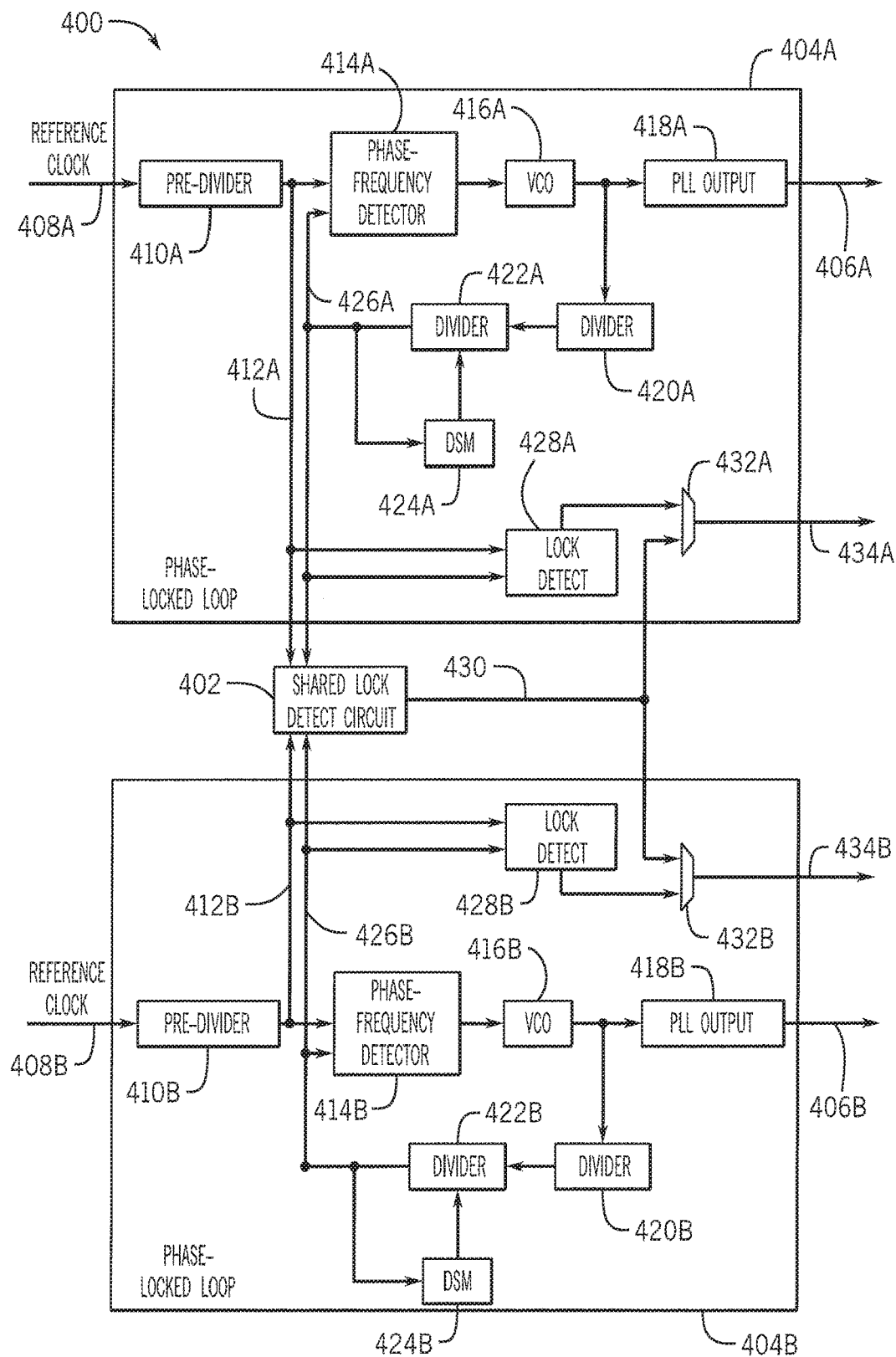
FIG. 5 is a block diagram illustrating connections between PLL modules and a shared lock-detect circuitry, in accordance with an embodiment.

In some systems such as the one shown in block diagram 400 of FIG. 5, the shared lock-detect circuit 402 may be available as a shared resource to both PLL 404A and PLL 404B. PLLs 404A and 404B may be similar to PLL 102 of FIG. 4. In particular, blocks 410A, 414A, 416A, 418A, 420A, 422A, 424A, 428A, and 432A may be similar to blocks 308, 312, 316, 318, 320, 322, 324, 304, and 332, respectively. Similarly, blocks 410B, 414B, 416B, 418B, 420B, 422B, 424B, 428B and 432B may be also be similar to blocks 308, 312, 316, 318, 320, 322, 324, 304 and 332, respectively. PLL 404A may produce a PLL output clock signal 406A and a lock-detect signal 434A while PLL 404B may produce a PLL output clock signal 406B and a lock-detect signal 434B.

The shared lock-detect circuit 402 may receive an internal reference clock signal 412A and a return clock signal 426A from PLL 404A. Shared lock-detect circuit 402 may also receive an internal reference clock signal 412B and a return clock signal 426B from PLL 404B. The shared lock-detect circuit 402 may employ a switch or any other mechanism to choose between inputs from PLL 404A or from PLL 404B to produce a lock-detect signal 430. For example, if the shared lock-detect circuit 402 is currently serving a PLL 404A, it may calculate a lock-detect signal 430 based on internal reference clock signal 412A and return clock signal 426A. Accordingly, multiplexor 432A of PLL 404A may be adjusted such that the lock-detect signal 434A is equal to lock-detect signal 430. Note that in this situation, multiplexor 432B of PLL 404B may be adjusted such that its lock-detect signal 434B is equal to the lock-detect signal coming from internal lock-detect 428B.

Similarly, if the shared lock-detect circuit 402 is currently serving PLL 404B, it will calculate a lock-detect signal 430 based on internal reference clock signal 412B and return clock signal 426B from PLL 404B. Accordingly, multiplexor 432B of PLL 404B may be adjusted such that lock-detect signal 434B is equal to lock-detect signal 430. Moreover, multiplexor 432A may be adjusted such that its lock-detect signal 434A is obtained from internal lock-detect 428A. Note that the shared lock-detect circuit 402 may be powered down and PLLs 404A and 404B may use its internal lock-detects 428A and 428B, respectively.

Figure 6:
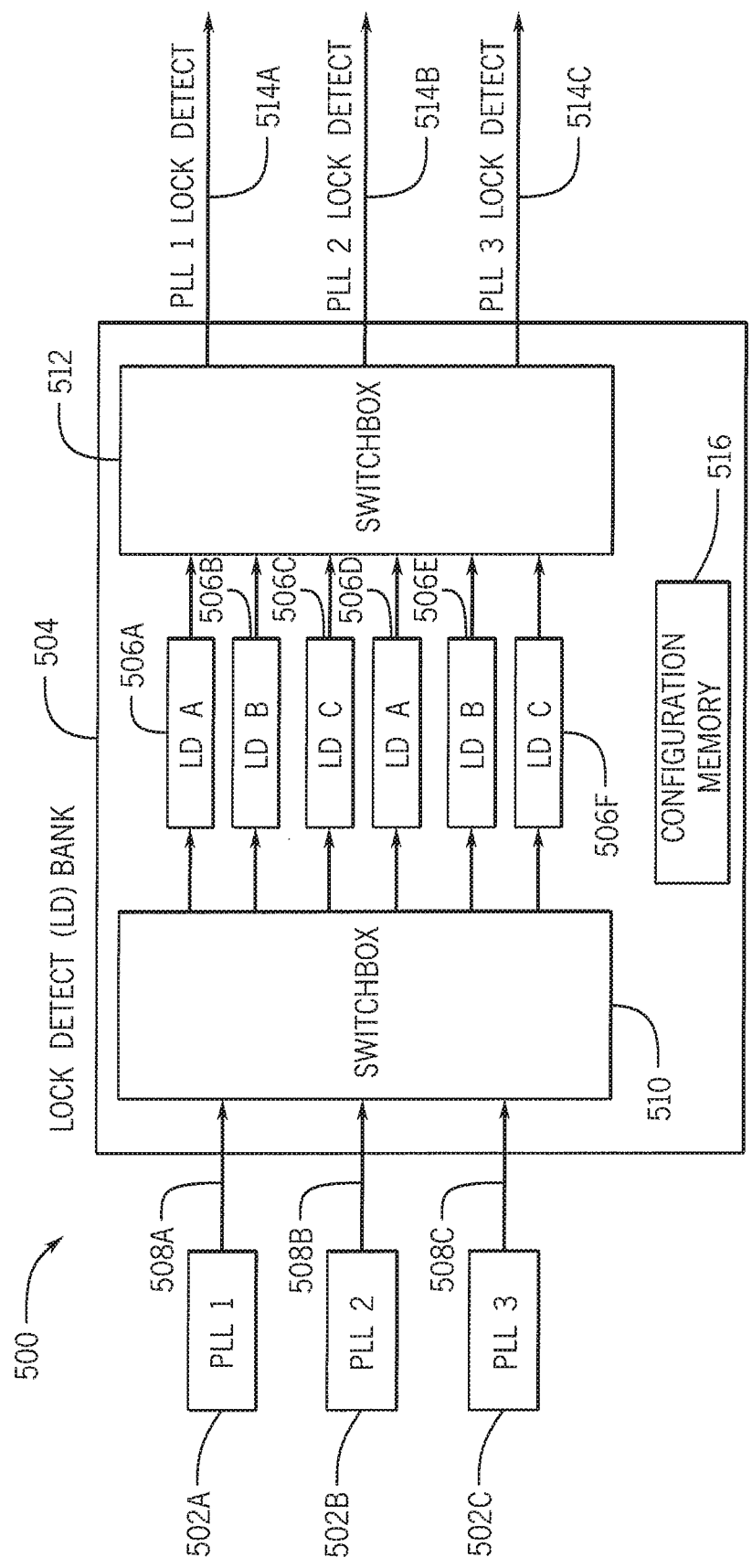
FIG. 6 illustrates a system that includes a lock-detect bank that may distribute lock-detect functionality to multiple PLL modules, in accordance with an embodiment.

The concept of sharing a lock-detect resource across multiple PLLs may be scalable to a system where multiple PLLs may have access to multiple lock-detect modules in a scalable fashion. Diagram 500 in FIG. 6 illustrates a system where PLLs 502A, 502B, and 502C may employ a lock-detect bank 504 with lock detection capability. In the example of FIG. 6, the lock-detect bank 504 may have multiple lock-detect modules 506A, 506B, 506 C, 506D, 506E, 506F. In other examples, any suitable number of lock-detect modules may be employed. Each of the PLLs 502A, 502B, and 502C may provide, to lock-detect bank 504, a clock reference signal, and a return clock signal via data busses 508A, 508B, and 508C. These clock signals may be received by an input switch box 510, which distributes the data to the chosen lock-detect modules 506A, 506B, 506 C, 506D, 506E, 506F. The output lock-detect signal may be provided to output switch box 512 which uses a reverse mapping as the used by switch box 510 to provide the appropriate lock-detect signals 514A, 514B, and 514C.

The mapping employed by switchboxes 510 and 512 may be have the information that connects which lock-detect module is linked to which PLL. This information may be stored in a configuration memory 516. Configuration memory 516 may also contain information related to the configuration of each of the lock-detect circuits 506A-F. The multiple lock-detect modules 506A-F may be of different types. Therefore, it may be useful for the system to dynamically change the mapping stored in configuration memory 516, and employed by switchboxes 510 and 512, based on specifications of the PLL system.

The lock-detect bank 504 may be useful in systems that may have multiple PLLs, such as systems that may send or receive data through multiple high-speed serial interfaces. Such systems, which may include Universal Serial Bus (USBs) and Peripheral Component Interface (PCI), often have multiple transmitters and receivers that may use a clock-and-data recovery (CDR) modules. As discussed above, these modules may employ PLLs such as 502A-C to improve the performance of the CDRs and the use of lock-detect modules may reduce errors in data reception. A lock-detect bank 504 may increase resource efficiency by facilitating dynamic rearrangement of lock-detect modules 506A-F based on needs from the PLLs 502A-C tied to different CDRs.

This type of system may be useful in programmable circuits such as programmable logic devices and field-programmable gate arrays (FPGA). For example, routes between PLLs and a lock-detect circuit bank may be identified by solving a routing problem under resource constraints. As a result, the use of lock-detect circuit bank may be modeled as placement and routing in FPGAs and, therefore, may employ adaptations of solutions from electronic circuit design software, minimizing the burden in software development and utilization.

Benefits of embodiments described herein include systems in which PLL modules may use lock-detect modules with multiple configurations in a flexible and scalable manner. For example, in some systems a PLL module may be able to access any of multiple lock-detect circuits. In some systems, a PLL module may be able to choose between using internal lock-detect circuits and/or external lock-detect circuits. Some systems may have multiple PLL modules sharing an external lock-detect circuit or selecting a lock-detect circuit from a lock-detect circuit bank. Therefore, embodiments may provide a solution to the complex problem of providing lock-detect circuits that are compatible with any of a number of particular PLL configurations while conserving on-chip resources and retaining flexibility for a large number of circuits implemented.

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. An electrical system comprising:
a phase-locked loop circuitry comprising an internal lock-detect circuitry, wherein the phase-locked loop circuitry produces an output clock signal and the internal lock-detect circuitry produces a first lock-detect signal, wherein the internal lock-detect comprises an analog lock-detect circuitry;
an external lock-detect circuitry external to the phase-locked loop circuitry that receives at least a return clock signal from the phase-locked loop circuitry and provides a second lock-detect signal, wherein the external lock-detect circuitry comprises a digital lock-detect circuitry; and
a selector module that receives the first lock-detect signal and the second lock-detect signal and provides an output lock-detect signal that indicates a quality of the output clock signal.

2. The electrical system of claim 1, wherein the external lock-detect circuitry has a first error range substantially smaller than a second error range of the internal lock-detect circuitry.

3. The electrical system of claim 1, wherein the quality of the output clock signal comprises a difference between a reference clock signal and the return clock signal.

4. The electrical system of claim 1, wherein the external lock-detect circuitry has an error range of less than a part per million.

5. The electrical system of claim 1, wherein the phase-locked loop circuitry includes an integer multiplier.

6. The electrical system of claim 1, wherein the phase-locked loop circuitry includes a fractional multiplier.

7. The electrical system of claim 1, comprising a second phase-locked loop circuitry comprising a second internal lock-detect circuitry, wherein the second phase-locked loop circuitry produces a second output clock signal and the external lock-detect circuitry receives at least the second output clock signal from the second phase-locked loop circuitry and provides the second lock-detect signal that indicates a quality of the second output clock signal.

8. The electrical system of claim 1, wherein the external lock-detect circuitry receives a reference clock signal and the return clock signal from the phase-locked loop circuitry and produces a lock-detect signal based on the reference clock signal and the return clock signal.

9. An electrical system comprising:
 a phase-locked loop circuitry that produces an output clock signal based on a reference clock signal;
 a first lock-detect circuitry that receives at least the reference clock signal and a return clock signal and produces a first lock-detect signal that indicates a quality of the output clocks signal within a first error range; and
 a second lock-detect circuitry that receives at least the reference clock signal and the return clock signal and produces a second lock-detect signal that indicates the quality of the output clock signal within a second error range substantially smaller than the first error range.

10. The electrical system of claim 9, wherein the phase-locked loop circuitry comprises a selector module receives the first lock-detect signal and the second lock-detect signal and produces a third lock-detect signal.

11. The electrical system of claim 10, wherein the selector module provides the first lock-detect signal as the third lock-detect signal and a reduces a power of the second lock-detect circuitry is reduced.

12. The electrical system of claim 9, wherein the reference clock signal comprises a serial data signal.

13. The electrical system of claim 9, wherein the first lock-detect circuitry is an analog lock-detect circuitry and the second lock-detect circuitry is a digital lock-detect circuitry.

\* \* \* \* \*